US008710551B2

(12) United States Patent
Huang et al.

(10) Patent No.: US 8,710,551 B2
(45) Date of Patent: Apr. 29, 2014

(54) HIGH ELECTRON MOBILITY TRANSISTOR AND MANUFACTURING METHOD THEREOF

(75) Inventors: Chih-Fang Huang, Hsinchu (TW); Chien-Wei Chiu, Beigang Township, Yunlin County (TW); Ting-Fu Chang, Taipei (TW); Tsung-Yu Yang, Kaohsiung (TW); Tsung-Yi Huang, Hsinchu (TW)

(73) Assignee: Richtek Technology Corporation, R.O.C., Hsin-Chu (TW)

( * ) Notice: Subject to any disclaimer, the term of this patent is extended or adjusted under 35 U.S.C. 154(b) by 16 days.

(21) Appl. No.: 13/597,599

(22) Filed: Aug. 29, 2012

(65) Prior Publication Data
US 2014/0061724 A1 Mar. 6, 2014

(51) Int. Cl.
*H01L 31/109* (2006.01)
*H01L 31/072* (2012.01)

(52) U.S. Cl.
USPC ........... 257/194; 257/192; 257/200; 257/201; 438/167; 438/172

(58) Field of Classification Search
USPC .................. 257/192, 194, 200–201, E21.451, 257/E29.317; 438/167, 172
See application file for complete search history.

(56) References Cited

U.S. PATENT DOCUMENTS 6,750,482 B2 * 6/2004 Seaford et al. ................ 257/191
2010/0052016 A1 * 3/2010 Hooper et al. ................ 257/201

* cited by examiner

*Primary Examiner* — Theresa T Doan
(74) *Attorney, Agent, or Firm* — Tung & Associates

(57) ABSTRACT

The present invention discloses a high electron mobility transistor (HEMT) and a manufacturing method thereof. The HEMT includes a semiconductor layer, a barrier layer on the semiconductor layer, a piezoelectric layer on the barrier layer, a gate on the piezoelectric layer, and a source and a drain at two sides of the gate respectively, wherein each bandgap of the semiconductor layer, the barrier layer, and the piezoelectric layer partially but not entirely overlaps the other two bandgaps. The gate is formed for receiving a gate voltage. A two dimensional electron gas (2DEG) is formed in a portion of a junction between the semiconductor layer and the barrier layer but not below at least a portion of the piezoelectric layer, wherein the 2DEG is electrically connected to the source and the drain.

5 Claims, 4 Drawing Sheets

_US 8,710,551 B2_

HIGH ELECTRON MOBILITY TRANSISTOR AND MANUFACTURING METHOD THEREOF

BACKGROUND OF THE INVENTION

1. Field of Invention

The present invention relates to a high electron mobility transistor (HEMT) and a manufacturing method thereof; particularly, it relates to an enhanced mode HEMT and manufacturing method thereof.

2. Description of Related Art

FIGS. 1A and 1B show a schematic cross-section view and a band diagram of a prior art high electron mobility transistor (HEMT) 100. As shown in FIG. 1A, a gallium nitride (GaN) layer 12 is formed on a substrate 11, and an isolation region 13 is formed in the GaN layer 12. The isolation region 13 for example is formed by a shallow trench isolation (STI) process or a local oxidation of silicon (LOCOS) process, the former being shown in the figure. The HEMT 100 further includes an aluminum gallium nitride (AlGaN) layer 14, a gate 15, a source 16, and a drain 17 besides the GaN layer 12 and the isolation region 13. A two dimensional electron gas (2DEG) 18 is formed at the junction between the GaN layer 12 and the AlGaN layer 14, and the 2DEG 18 is electrically connected to the source 16 and the drain 17. As shown in FIG. 1B, The Fermi level Efs of the GaN layer 12 and the Fermi level Efb of the AlGaN layer 14 are at the same level. The conduction levels, i.e., the lowest level of the conduction band, Ecs of the GaN layer 12 and Ecb of the AlGaN layer 14, and the valence levels, i.e., the highest level of the valence band, Evs of the GaN layer 12 and Evb of the AlGaN layer 14, are bended at the junction of the GaN layer 12 and the AlGaN layer 14, such that the electrons are trapped in the electron well 18a. These trapped electrons can eliminate Coulomb scattering to increase the electron mobility in the 2DEG 18, such that the operation speed of the HEMT 100 is faster than a conventional semiconductor device at ON state.

However, the HEMT 100 is a depletion device, i.e., the gate voltage of the HEMT 100 is negative during normal operations. In practical applications, it is not convenient to adopt and operate a depletion device, especially in high frequency applications. A positive gate voltage of an HEMT during normal operations can decrease the complexity of the circuitry and the manufacturing cost.

In view of above, to overcome the drawbacks in the prior art, the present invention proposes an enhanced mode HEMT and a manufacturing method thereof which provide a lower manufacturing cost, and the HEMT may have a broader application range.

SUMMARY OF THE INVENTION

A first objective of the present invention is to provide an HEMT.

A second objective of the present invention is to provide a manufacturing method of an HEMT.

To achieve the objectives mentioned above, from one perspective, the present invention provides an HEMT, including: a semiconductor layer, which has a semiconductor bandgap; a barrier layer, which is formed on the semiconductor layer, and has a barrier bandgap; a piezoelectric layer, which is formed on the barrier layer, and has a piezoelectric bandgap, wherein each one of the semiconductor bandgap, the barrier bandgap, and the piezoelectric bandgap partially but not entirely overlaps the other two bandgaps; a gate, which is formed on the piezoelectric layer for receiving a gate voltage; and a source and a drain, which are formed at two sides of the gate respectively; wherein a two dimensional electron gas (2DEG) is formed in a portion of a junction between the semiconductor layer and the barrier layer but not below at least a portion of the piezoelectric layer, and the 2DEG is electrically connected to the source and the drain.

From another perspective, the present invention provides a manufacturing method of a high electron mobility transistor (HEMT), including: providing a semiconductor layer, which has a semiconductor bandgap; forming a barrier layer, which is formed on the semiconductor layer, and has a barrier bandgap; forming a piezoelectric layer on the barrier layer, which has a piezoelectric bandgap, wherein each one of the semiconductor bandgap, the barrier bandgap, and the piezoelectric bandgap partially but not entirely overlaps the other two bandgaps; forming a gate on the piezoelectric layer for receiving a gate voltage; and forming a source and a drain at two sides of the gate respectively; wherein a two dimensional electron gas (2DEG) is formed in a portion of a junction between the semiconductor layer and the barrier layer but not below at least a portion of the piezoelectric layer, and the 2DEG is electrically connected to the source and the drain.

In one preferable embodiment, the HEMT further includes an insulation layer, which is formed upon or beneath the piezoelectric layer, wherein the insulation layer is connected to the piezoelectric layer.

In another embodiment of the HEMT, the piezoelectric layer preferably includes zinc oxide.

In yet another embodiment of the HEMT, the semiconductor layer preferably includes gallium nitride, and the barrier layer includes aluminum gallium nitride.

In yet another embodiment, the semiconductor layer is preferably formed on a silicon substrate, a silicon carbide substrate, or a sapphire substrate, and a buffer layer is formed between the substrate and the semiconductor layer.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
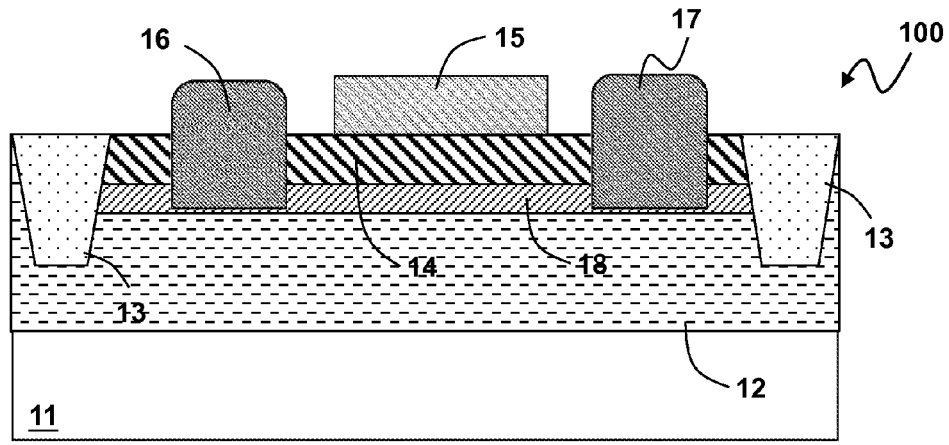
FIGS. 1A and 1B show a schematic cross-section view and a band diagram of a conventional high electron mobility transistor (HEMT) 100.
Figure 1B:
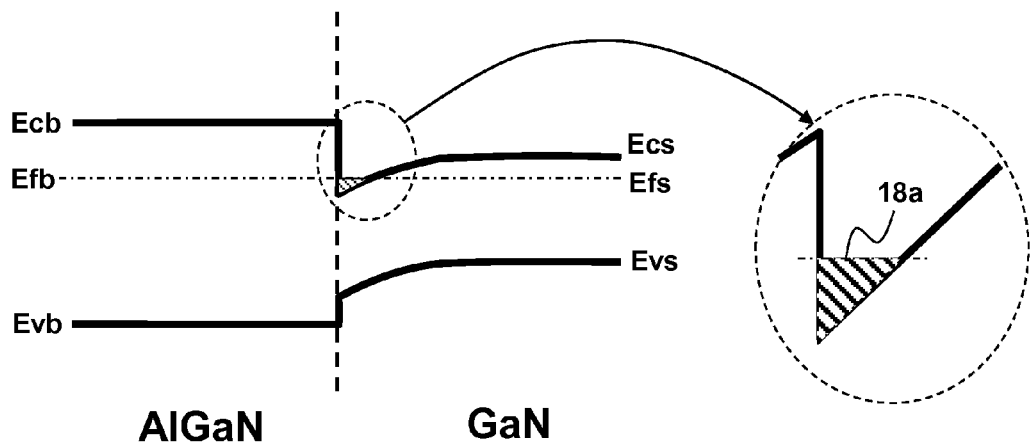
Figure 2:
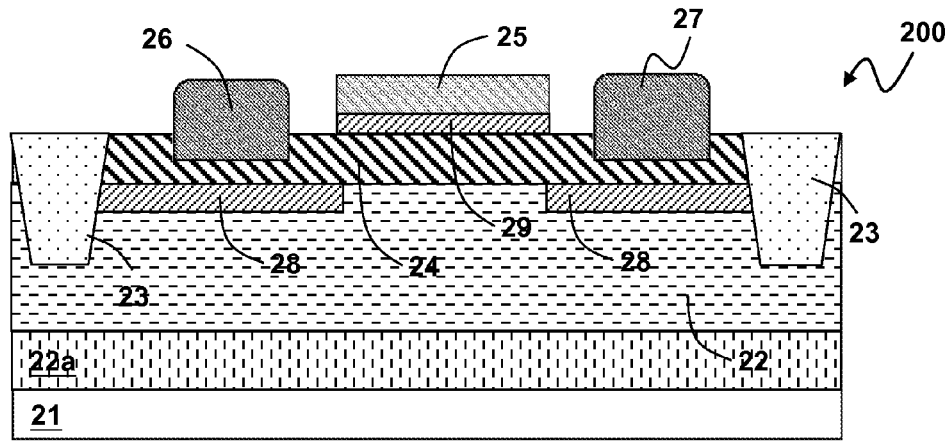
FIGS. 2 and 3A-3B show a first embodiment of the present invention.
Figure 3A:
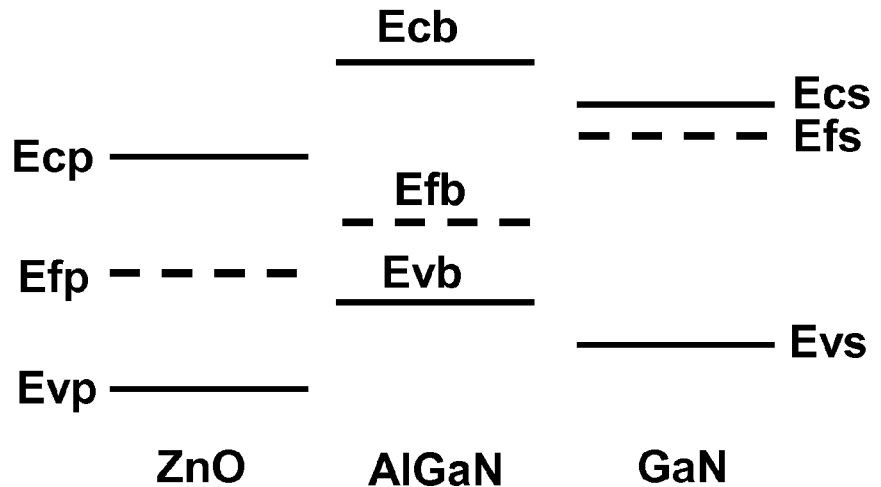
Figure 3B:
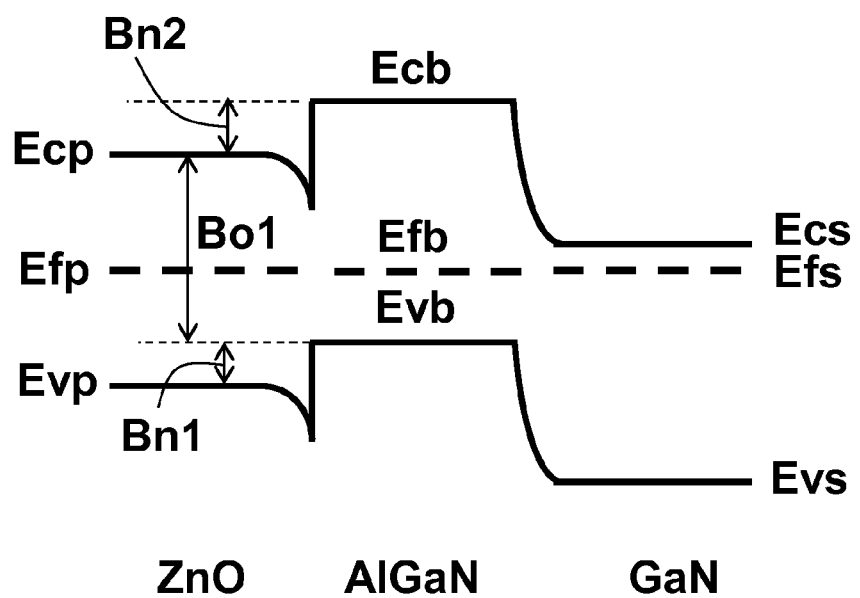

Please refer to FIGS. 2 and 3A-3B for a first embodiment according to the present invention. As shown in FIG. 2, a high electron mobility transistor (HEMT) 200 is formed on a substrate 21, and the substrate 21 is for example but not limited to a silicon substrate, a silicon carbide substrate, or a sapphire substrate. A buffer layer 22a is formed on the substrate 21 by for example but not limited to an epitaxial growth process. Next, a semiconductor layer 22 is formed on the buffer layer 22a by for example but not limited to an epitaxial growth process. The buffer layer 22a is for example but not limited to a silicon layer, and the semiconductor layer 22 is for example but not limited to a layer primarily containing gallium nitride (GaN). Besides, the HEMT 200 further includes a barrier layer 24, a gate 25, a source 26, a drain 27, and a piezoelectric layer 29. The semiconductor layer 22, the barrier layer 34, and the piezoelectric layer 29 are for example but not limited to the layer primarily containing GaN, a layer primarily containing aluminum gallium nitride (AlGaN), and a layer primarily containing zinc oxide (ZnO), respectively, which are referred to as GaN layer, AlGaN layer and ZnO layer hereinafter, but it does not mean that these layer must completely contain 100% GaN, AlGaN and ZnO. As shown in FIG. 3A, the band diagrams of the GaN layer, the AlGaN layer, and the ZnO layer respectively include a semiconductor bandgap between a conduction level Ecs and a valence level Evs, a barrier bandgap between a conduction level Ecb and a valence level Evb, and a piezoelectric bandgap between a conduction level Ecp and a valence level Evp. The conduction levels Ecs, Ecb, and Ecp, the Fermi levels (Efes, Efb, Efp) and the valence levels (Evs, Evb, Evp) of the aforementioned respective band diagrams are shown in the figure. When the GaN layer, the AlGaN layer, and the ZnO layer are connected, the conduction levels and the valence levels bend as shown in FIG. 3B. As shown in FIG. 3A, each bandgap of the semiconductor bandgap, the barrier bandgap, and the piezoelectric bandgap partially but not entirely overlaps the other two bandgaps, i.e., the semiconductor bandgap partially but not entirely overlaps the buffer bandgap and the piezoelectric bandgap, the buffer bandgap partially but not entirely overlaps the semiconductor bandgap and the piezoelectric bandgap, and the piezoelectric bandgap partially but not entirely overlaps the semiconductor bandgap and the buffer bandgap. The gate 25 is formed on the piezoelectric layer 29 for receiving a gate voltage to turn ON or OFF the HEMT 200. The source 26 and the drain 27 are formed at two sides of the gate 25 respectively. A 2DEG 28 is formed in a portion of a junction between the semiconductor layer and the barrier layer but not below at least a substantial portion of the piezoelectric layer, and the 2DEG 28 is electrically connected to the source 26 and the drain 27. The HEMT 200 further includes for example but not limited to an isolation region 23. The isolation region 23 may be formed by for example an STI process as shown in the figure, a LOCOS process, or an ion implantation process which implants p-type or n-type impurities in the semiconductor layer 22.

This embodiment is different from the prior art in that, in this embodiment, each of the semiconductor bandgap, the barrier bandgap, and the piezoelectric bandgap partially but not entirely overlaps the other two bandgaps. For example, referring to FIG. 3B, the piezoelectric bandgap has a part Bo1 which overlaps the barrier bandgap, and a part Bn1 which does not overlap the barrier bandgap (on the other hand, the barrier bandgap has a part Bn2 which does not overlap the piezoelectric bandgap), wherein the piezoelectric layer 29 and the barrier layer 24 are for example but not limited to the ZnO layer and the AlGaN layer respectively. The semiconductor bandgap and the barrier bandgap respectively also have a part which overlaps the other two bandgaps and another part which does not overlap the other two bandgaps. This arrangement is advantageous in that, first, a portion of the 2DEG 28 below the gate 25 is depleted by the piezoelectric layer 29, and when a positive voltage is applied to the gate 25, the portion of the 2DEG 28 below the gate 25 is formed and electrically connects the source 26 and the drain 27 to turn ON the HEMT 200, such that the HEMT 200 is an enhanced mode device. Second, the barrier bandgap is not limited to being wider than the semiconductor bandgap, and the piezoelectric bandgap is not equal to the semiconductor bandgap, such that the enhanced mode HEMT according to the present invention has a wider application range.

Figure 4:
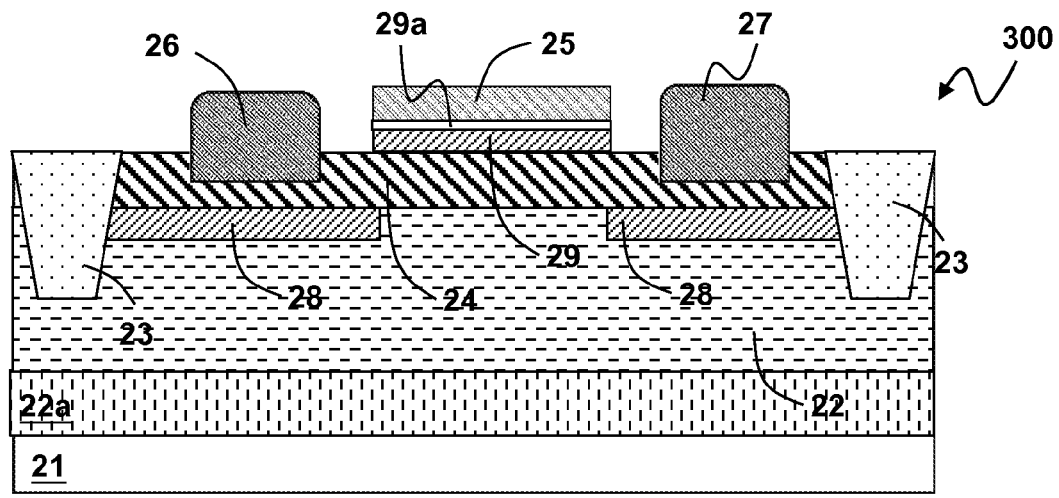
FIG. 4 shows a second embodiment of the present invention.

FIG. 4 shows a second embodiment of the present invention. This embodiment is different from the first embodiment in that, in this embodiment, an HEMT 300 further includes an insulation layer 29a, which is formed upon and connected to the piezoelectric layer 29. The insulation layer 29a includes for example but not limited to a material such as aluminum oxide or silicon oxide, etc. This arrangement is advantageous in that, the gate leakage current is decreased, such that the device performance of the HEMT 300 is improved.

Figure 5:
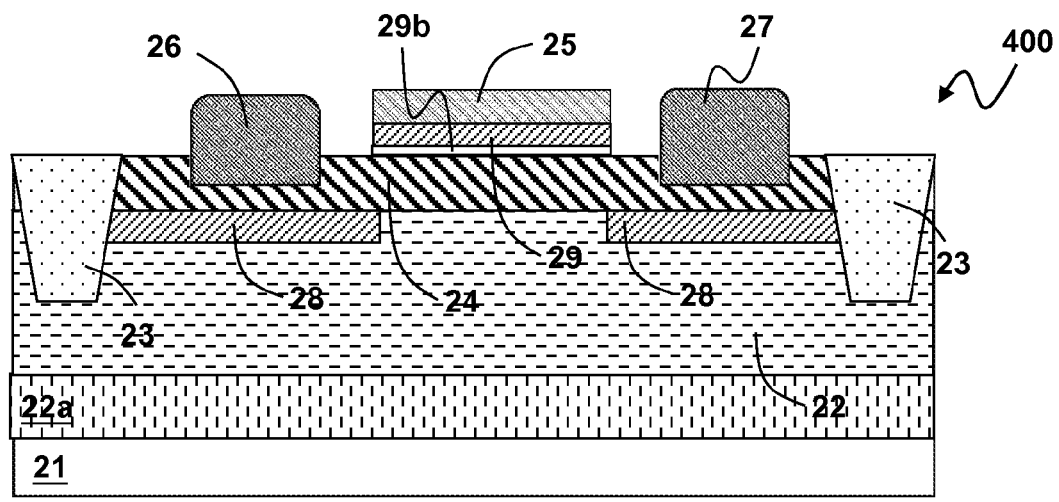
FIG. 5 shows a third embodiment of the present invention.

FIG. 5 shows a third embodiment of the present invention. This embodiment is different from the first embodiment in that, in this embodiment, an HEMT 400 further includes an insulation layer 29b, which is formed beneath and connected to the piezoelectric layer 29. The insulation layer 29b includes for example but not limited to a material such as aluminum oxide or silicon oxide, etc. Similar to the second embodiment, this arrangement is advantageous in that, the gate leakage current is decreased, such that the device performance of the HEMT 400 is improved.

Figure 6A:
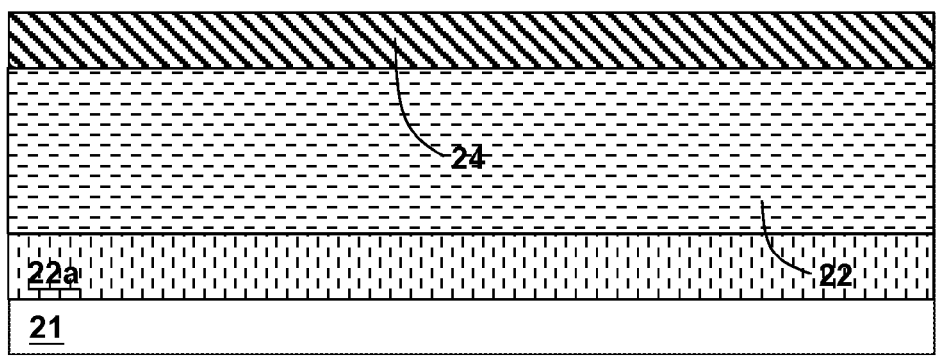
FIGS. 6A-6D show a fourth embodiment of the present invention.

FIGS. 6A-6D are a fourth embodiment of the present invention, which shows schematic cross-section views of a manufacturing method of the HEMT 200. As shown in FIG. 6A, the substrate 21 is provided, which is for example but not limited to the silicon substrate, the silicon carbide substrate, or the sapphire substrate. Next, the buffer layer 22a is formed on the substrate 21 by for example but not limited to an epitaxial process, wherein the buffer layer 22a is for example but not limited to a silicon layer. Next, the semiconductor layer 22 is formed on the buffer layer 22a by for example but not limited to an epitaxial process, wherein the semiconductor layer 22 is for example but not limited to a GaN layer. Next, the barrier layer 24 is formed on the semiconductor layer 22, wherein the barrier layer 24 is for example but not limited to an AlGaN layer.

Figure 6B:
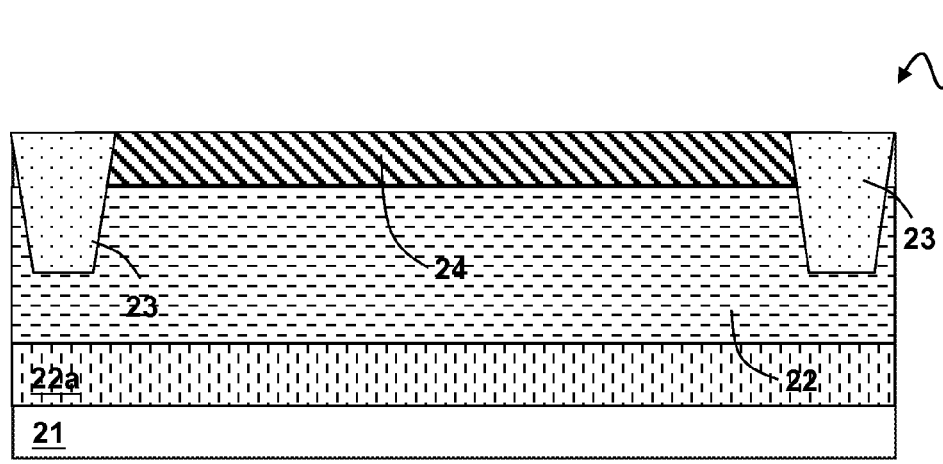

Next, as shown in FIG. 6B, the isolation region 23 is formed, which may be formed by for example the STI process as shown in the figure, a LOCOS process, or an ion implantation process which implants p-type or n-type impurities in the semiconductor layer 22.

Figure 6C:
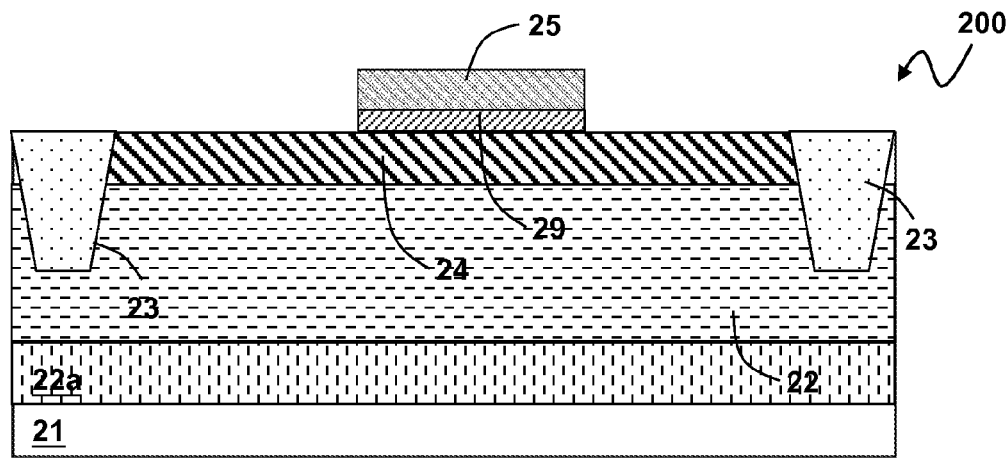

Next, as shown in FIG. 6C, the piezoelectric layer 29 is formed on the barrier layer 24, and the gate 25 is formed on the piezoelectric layer 29. The gate 25 and the piezoelectric layer 29 cover for example but not limited to the same region on the barrier 24, such that the gate voltage can control the formation of the portion of the 2DEG 28 below the gate.

Figure 6D:
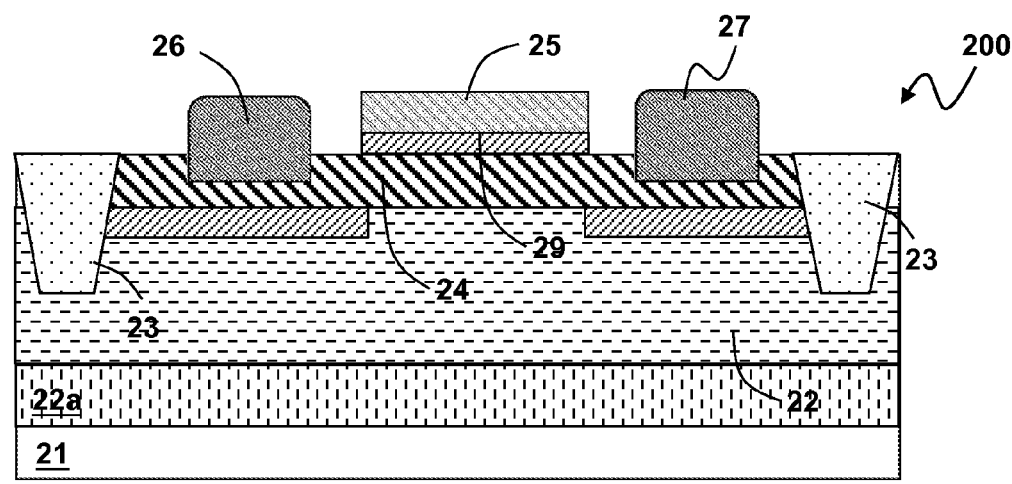

Next, as shown in FIG. 6D, the source 26 and the drain 27 are formed by for example but not limited to the same process. The source 26 and drain 27 include for example but not limited to titanium, aluminum, nickel, gold, etc.

Note that, the substrate 21, the buffer layer 22a, the semiconductor layer 22, the barrier layer 24, and the piezoelectric layer 29 may either be intrinsic semiconductor, or with p-type or n-type doped impurities. The portion of the 2DEG 28 at the junction between the barrier layer 24 and the semiconductor layer 22 below the piezoelectric layer 29 is depleted because of the effect of the junction between the barrier layer 24 and the piezoelectric layer 29此句翻得很好, such that the HEMT according to the present invention is an enhanced mode device, i.e., the gate voltage is positive to turn ON the device. The gate may be formed by metal materials for example but not limited to Schottky or Ohm metal, such as titanium, platinum, chromium, nickel, tungsten, or their alloy(s).

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a passivation layer, etc., can be added. In view of the foregoing, the spirit of the present invention should cover all such and other modifications and variations, which should be interpreted to fall within the scope of the following claims and their equivalents.

What is claimed is:

1. A high electron mobility transistor (HEMT), comprising:
   a semiconductor layer, which has a semiconductor bandgap;
   a barrier layer, which is formed on the semiconductor layer, and has a barrier bandgap;
   a piezoelectric layer, which is formed on the barrier layer, and has a piezoelectric bandgap, wherein each one of the semiconductor bandgap, the barrier bandgap, and the piezoelectric bandgap partially but not entirely overlaps the other two bandgaps;
   a gate, which is formed on the piezoelectric layer for receiving a gate voltage; and
   a source and a drain, which are formed at two sides of the gate respectively;
   wherein a two dimensional electron gas (2DEG) is formed in a portion of a junction between the semiconductor layer and the barrier layer but not below at least a portion of the piezoelectric layer, and the 2DEG is electrically connected to the source and the drain.

2. The HEMT claim 1, further comprising an insulation layer, which is formed upon or beneath the piezoelectric layer, wherein the insulation layer is connected to the piezoelectric layer.

3. The HEMT of claim 1, wherein the piezoelectric layer includes zinc oxide.

4. The HEMT of claim 1, wherein the semiconductor layer includes gallium nitride, and the barrier layer includes aluminum gallium nitride.

5. The HEMT of claim 1, wherein the semiconductor layer is formed on a silicon substrate, a silicon carbide substrate, or a sapphire substrate, and a buffer layer is formed between the substrate and the semiconductor layer.

* * * * *